(12) United States Patent
Anders et al.

(10) Patent No.: US 7,275,204 B2
(45) Date of Patent: Sep. 25, 2007

(54) DISTRIBUTED RING CONTROL CIRCUITS FOR VITERBI TRACEBACK

(75) Inventors: Mark A. Anders, Hillsboro, OR (US);
Sanu K. Matthew, Hillsboro, OR (US);
Ram K. Krishnamurthy, Portland, OR (US)

(73) Assignee: Marvell International Ltd., Hamilton (BE)

( * ) Notice: Subject to any disclaimer, the term of this patent is extended or adjusted under 35 U.S.C. 154(b) by 400 days.

(21) Appl. No.: 10/954,648

(22) Filed: Sep. 30, 2004

(65) Prior Publication Data

US 2006/0085730 A1  Apr. 20, 2006

(51) Int. Cl.
*H03M 13/41* (2006.01)

(52) U.S. Cl. ..................................... 714/795

(58) Field of Classification Search ................ 714/795
See application file for complete search history.

(56) References Cited

U.S. PATENT DOCUMENTS

| | | | | |
|---|---|---|---|---|
| 4,583,078 A * | 4/1986 | Shenoy et al. | ................ | 341/51 |
| 5,502,735 A * | 3/1996 | Cooper | ....................... | 714/794 |
| 5,513,139 A * | 4/1996 | Butler | .................... | 365/189.04 |
| 5,878,092 A * | 3/1999 | Choi | ........................... | 375/341 |
| 5,881,106 A * | 3/1999 | Cartier | ...................... | 375/262 |
| 5,970,097 A * | 10/1999 | Ishikawa et al. | ............ | 375/262 |
| 5,996,112 A * | 11/1999 | Dabiri et al. | ............... | 714/795 |
| 6,324,226 B1 * | 11/2001 | Sasagawa | .................... | 375/341 |
| 6,407,597 B1 * | 6/2002 | Ishiwaki | ..................... | 327/142 |
| 6,477,680 B2 * | 11/2002 | Mujtaba | ..................... | 714/795 |
| 6,601,215 B1 | 7/2003 | Thurnhofer | | |
| 6,725,418 B2 * | 4/2004 | Sawaguchi et al. | ......... | 714/795 |

OTHER PUBLICATIONS

Kang, et al., "Low-Power Viterbi Decoder for CDMA Mobile Terminals", IEEE Journal of Solid-State Circuits, vol. 33, No. 3, Mar. 1998, pp. 473-482.*
*Chapter 13: Shift Registers, Chapter Summary and key concepts*, Prentice Hall: http://cwx.prenhall.com/kleitz/chapter13/custom2/deluxe-content.html, (2002), 1-4.
Dawid, H., et al., "Viterbi Decoders: High performance algorithms and architectures", Digital signal processing for multimedia systems, New York, NY: Marcel Dekker Inc, US, XP002225706, ISBN: 0-8247-1924-7, paragraph '16.4.6',(1999), 417-459.

* cited by examiner

*Primary Examiner*—Stephen M. Baker
(74) *Attorney, Agent, or Firm*—Gerstein & Borun LLP

(57) ABSTRACT

Shift resister rings are used to provide column access in a traceback memory during Viterbi decoding.

20 Claims, 8 Drawing Sheets

DISTRIBUTED RING CONTROL CIRCUITS FOR VITERBI TRACEBACK

TECHNICAL FIELD

The invention relates generally to Viterbi decoding and, more particularly, to traceback memories for use during Viterbi decoding.

BACKGROUND OF THE INVENTION

Viterbi decoding is a decoding technique that may be used to decode convolutional codes. An increasing number of wired and wireless communication protocols are requiring the use of Viterbi decoding during communication activities. One of the concerns that is typically addressed during the design of communication devices and other devices that utilize Viterbi decoding is power dissipation. It is generally desired that power dissipation be kept low in such devices, while circuit performance is maintained at or above a desired level. Therefore, there is a need for energy efficient methods and structures for implementing Viterbi decoding.

DETAILED DESCRIPTION

Figure 1:
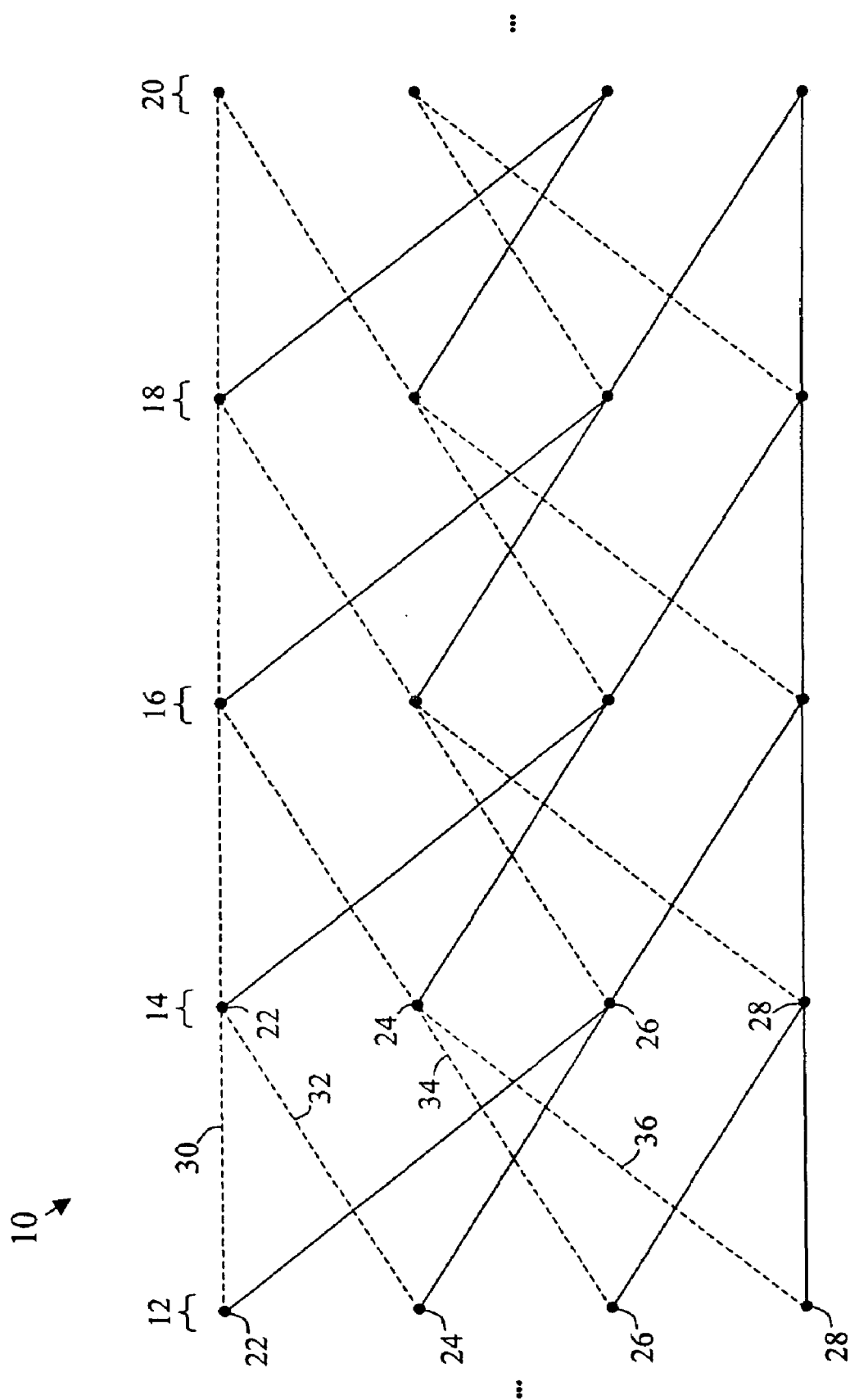
FIG. 1 is a diagram illustrating a portion of a trellis diagram associated with a Viterbi decoder.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Viterbi decoders have many applications. In a communication system, for example, a Viterbi decoder may be used in a receiver to determine a symbol stream that was most likely transmitted by a remote transmitter, based on a received symbol stream. Other applications also exist (e.g., within data storage systems, disk drives, etc.). The operation of a Viterbi decoder may be represented using a trellis diagram. FIG. 1 is a diagram illustrating a portion of a trellis diagram 10 for a particular Viterbi decoder. As shown, the trellis diagram 10 includes a number of symbols 12, 14, 16, 18, 20. Each of the symbols 12, 14, 16, 18, 20 corresponds to a particular processing stage during the decoding process (e.g., symbol 12 may correspond to a stage i, symbol 14 to stage i+1, symbol 16 to stage i+2, and so on). Each of the symbols 12, 14, 16, 18, 20 has a predetermined number of states (represented by dots in FIG. 1). For example, in the illustrated embodiment, there are four states for each symbol; namely, a first state 22, a second state 24, a third state 26, and a fourth state 28. Other Viterbi decoders may have different numbers of states per symbol.

For any state 22, 24, 26, 28 within a symbol 12, 14, 16, 18, 20, there may be multiple braches (or transitions) that lead into the state. For example, for the first state 22 within symbol 14, there is a first branch 30 leading into the state 22 (from previous state 22) and a second branch 32 leading into the state 22 (from previous state 24). Likewise, for state 24 of symbol 14, there is a first branch 34 leading into the state 24 (from previous state 26) and a second branch 36 leading into the state 24 (from previous state 28), and so on. This branch pattern will typically repeat for each successive symbol of the trellis 10. Different types of Viterbi decoders may have a different number of branches leading to each state. The illustrated trellis is known as a radix 2 trellis because it has two braches leading to each state.

Based on received data, a branch metric is calculated for each branch of the trellis 10 between two successive symbols. For example, when processing is moving from symbol 12 to symbol 14, a branch metric is determined for branch 30, another branch metric is determined for branch 32, and so on. The branch metrics represent a "distance" between an actual received data symbol and a data symbol that corresponds to that branch. As processing proceeds from symbol to symbol through the trellis 10, a path metric is updated for multiple paths through the trellis by adding a previous path metric to a corresponding branch metric. The path metric represents an accumulated error sum for the associated path. Thus, when transitioning from symbol 12 to symbol 14, a path metric associated with state 22 of symbol 12 will be added to a branch metric associated with branch 30 to obtain a new path metric for state 22 of symbol 14. Similarly, a path metric associated with state 24 of symbol 12 will be added to a branch metric associated with branch 32 to obtain another new path metric for state 22 of symbol 14. However, only one of these new path metrics is permitted to continue through the trellis 10. The lower of the two path metrics is selected to continue as this metric has the lower accumulated error. The branch associated with the selected path metric is known as the survivor branch or the survivor transition. A similar process is completed for each of the states associated with symbol 14. This process is known as an add-compare-select (ACS) operation. As processing flows through the trellis 10, survivor transitions are selected for each state in each new symbol. This survivor transition information is saved within a traceback memory for later use. The selected path metrics for each state within each symbol may be stored within a path metric memory. A Viterbi decoder will often include one set of ACS units that may be used recursively to process the various trellis symbols.

After survivor transition information has been collected for at least a portion of a trellis, a traceback operation may be initiated for the trellis. A traceback operation is performed in a reverse direction through the trellis. During a traceback operation, one of the states of a particular symbol may be selected as a starting place. The process then proceeds backwards through the trellis following the survivor branch information in the traceback memory. In one possible approach, the state within the selected symbol that has the lowest path metric (i.e., accumulated error sum) is selected as the starting point. However, this is not a requirement because as long as the traceback operation goes back more than a predetermined number of symbols through the trellis (i.e., the traceback length), it will almost always find itself on the proper most likely path.

Once the traceback operation has traversed the required number of symbols, the "decoding" process may begin using the same path. The decoding process is essentially the reverse of the original encoding process. For each survivor transition from state to state on the associated path, there is a corresponding data value that is the decoded value. As the decoding process goes backward through the trellis, it determines each survivor transition that occurred (using the data within the traceback memory) and outputs the corresponding data values. The data values may then be reversed in direction to achieve the actual most likely transmitted data. As more and more data is written to the traceback memory, additional traceback and decoding operations may be initiated at new starting points within the trellis. A traceback memory may be used that includes less columns than are within the corresponding trellis. In such a case, the memory may be rewritten over and over again during processing.

Figure 2:
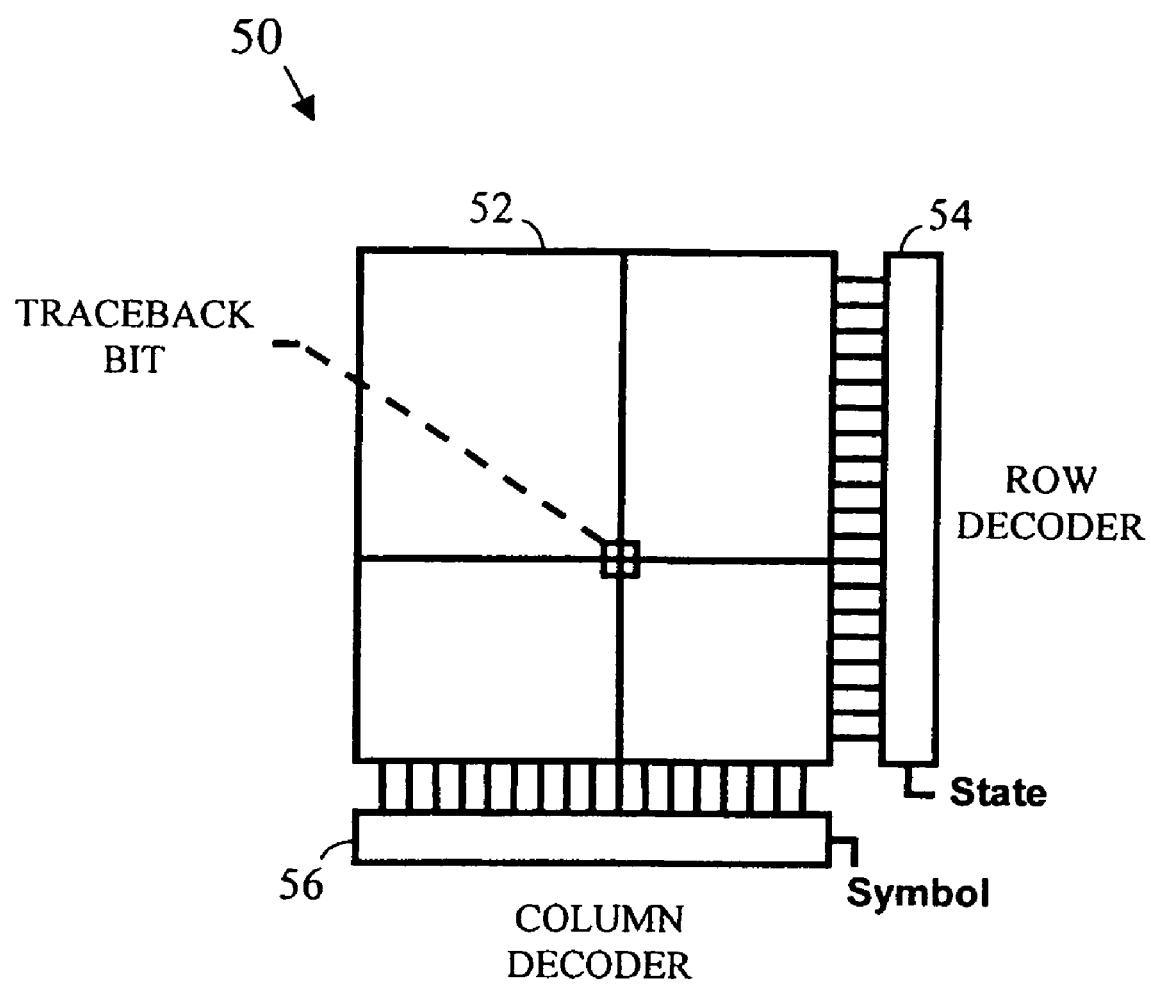
FIG. 2 is a block diagram illustrating an example traceback memory in accordance with an embodiment of the present invention.

FIG. 2 is a diagram illustrating an example traceback memory 50 in accordance with an embodiment of the present invention. As illustrated, the traceback memory 50 may include: a memory chip 52, a row decoder 54, and a column decoder 56. The memory chip 52 is a semiconductor memory that includes columns and rows of memory locations. The columns of the memory chip 52 may correspond to the symbols of the trellis. The rows of the memory chip 52 may correspond to the states of the trellis. A memory location is positioned at the intersection of each row and column. This memory location is used to store the survivor transition information for the corresponding state/symbol. The size of the memory location will depend upon the particular trellis being implemented. For example, in a radix-2 trellis, there are a maximum of two branches or transitions entering each state. Therefore, the survivor transition may be described using a single binary bit (i.e., either a logic one or a logic zero). If there are up to three transitions entering a state, then two binary bits are needed, and so on.

The row decoder 54 selects (enables) a row of the memory chip 52 corresponding to a trellis state of interest, based on a state address. The column decoder 56 selects (enables) a column of the memory chip 52 corresponding to a trellis symbol of interest, based on a symbol address. During a write operation, survivor transition information may be written to the memory location selected by the row decoder 54 and the column decoder 56. During a read operation (e.g., during traceback or decode), survivor transition information may be read from the memory location selected by the row decoder 54 and the column decoder 56. As processing flows forward through the trellis (from left to right in FIG. 1), the survivor transition information is written to the various storage locations of the memory chip 52. When the end of the memory chip 52 is reached (i.e., the rightmost column), the writing may continue at the beginning of the memory chip 52 (i.e., the leftmost column).

During traceback operations and decoding operations, data is read from the memory chip 52 to perform the corresponding functions. This will be performed in the opposite direction from the writing. Once a column and row have been enabled by the column decoder 56 and the row decoder 54, the corresponding traceback bit (or bits) may be read out and processed. The row decoder 54 and the column decoder 56 may then proceed back to the state within the previous symbol that was identified by the traceback bit(s), and so on.

Figure 3:
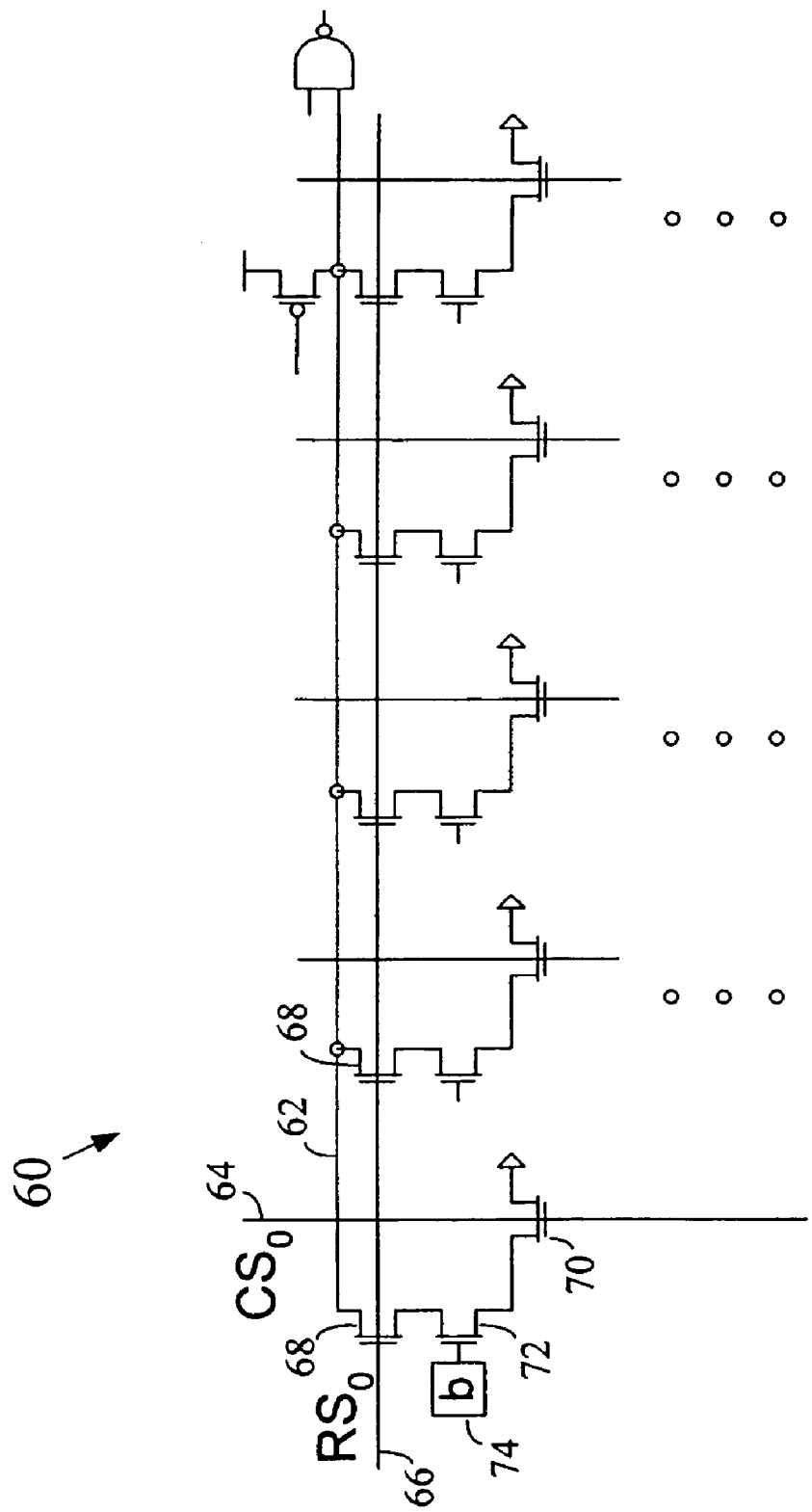
FIG. 3 is a circuit schematic illustrating an example memory architecture that may be used within the traceback memory of FIG. 2.

FIG. 3 is a circuit schematic illustrating an example memory architecture 60 that may be used to implement the memory chip 52 of FIG. 2. The memory architecture 60 stores a single bit for each row/column combination. A bit line 62 is operative for carrying the traceback bit from a corresponding storage location. The bit line 62 may be pre-charged before a read operation. The architecture 60 includes a plurality of column select lines (e.g., $CS_0$ 64, etc.) and a plurality of row select lines (e.g., $RS_0$ 66, etc). When the row select line $RS_0$ 66 is made logic high, the corresponding row of the memory is enabled by turning on the row transistors 68 for that row. Likewise, when the column select line $CS_0$ 64 is made logic high, the corresponding column of the memory is enabled by turning on the column transistors 70 for that column. Depending on the stored data bit 74, the corresponding storage transistor 72 will be either "on" or "off." If the storage transistor 72 is "on," the bit line 62 will be discharged and a first data bit value will be output. If "off," the bit line 62 will remain charged and a second, different data bit value will be output. Other memory architectures may alternatively be used.

Figure 4:
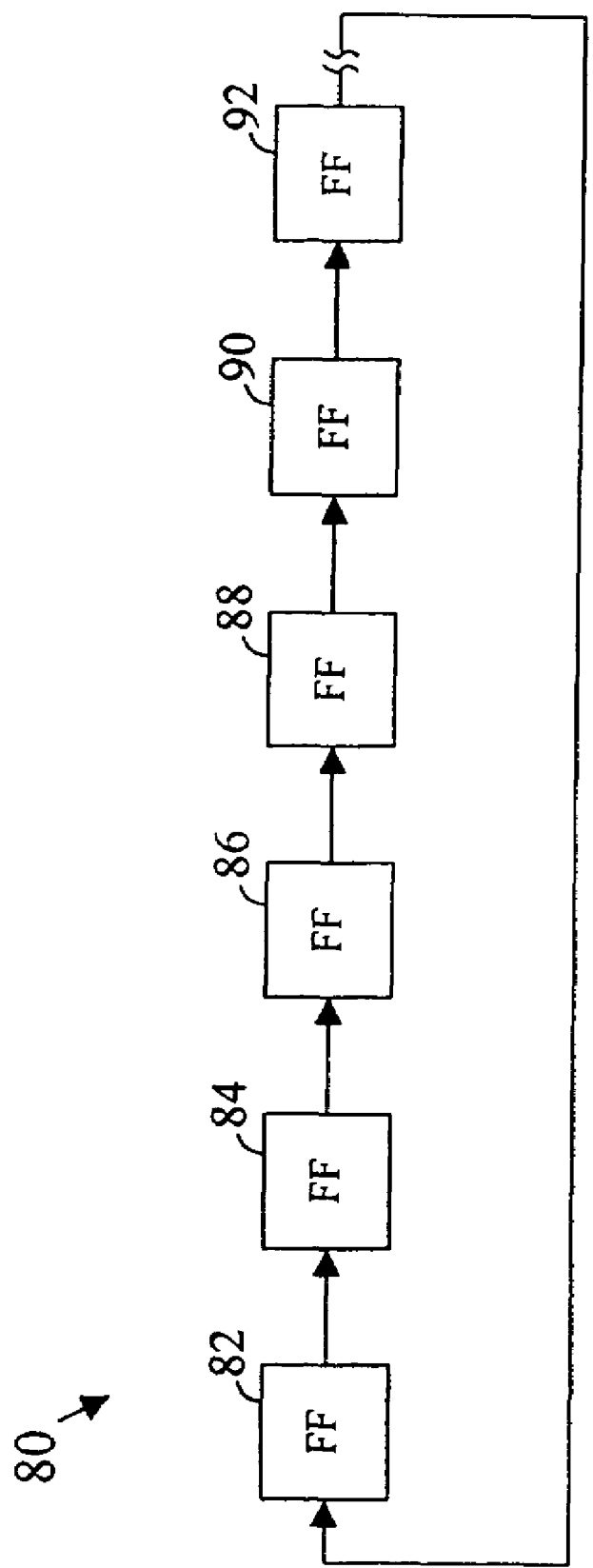
FIG. 4 is a block diagram illustrating an example shift register ring in accordance with an embodiment of the present invention.

In at least one embodiment of the present invention, the column decoder 56 of FIG. 2 is replaced by a number of shift register rings. FIG. 4 is a block diagram illustrating an example shift register ring 80 that may be used. As shown, the shift register ring 80 includes a number of flip flops 82, 84, 86, 88, 90, 92, . . . that are connected in series in a ring configuration. One of the flip flops 82, 84, 86, 88, 90, 92, . . . in the shift register ring 80 may be initially set to a logic one value and then the logic one value may be clocked through the ring from flip flop to flip flop to act as the column enable signal for the corresponding memory chip. Other one bit clockable memory devices may be used instead of flip flops (e.g., data latches, etc.). Unlike a column decoder, a shift register ring does not require a centralized address to access a desired column of the traceback memory. Instead, the shift register ring simply progresses from column to column in a linear style, as is typically required in a traceback memory. The use of a shift register ring, rather than a column decoder, can result in a significant power savings. For example, the switching capacitance during each decoder cycle may be reduced to that of only two flip flops, one changing from a logic zero to a logic one and the other changing from a logic one to a logic zero.

Figure 5:
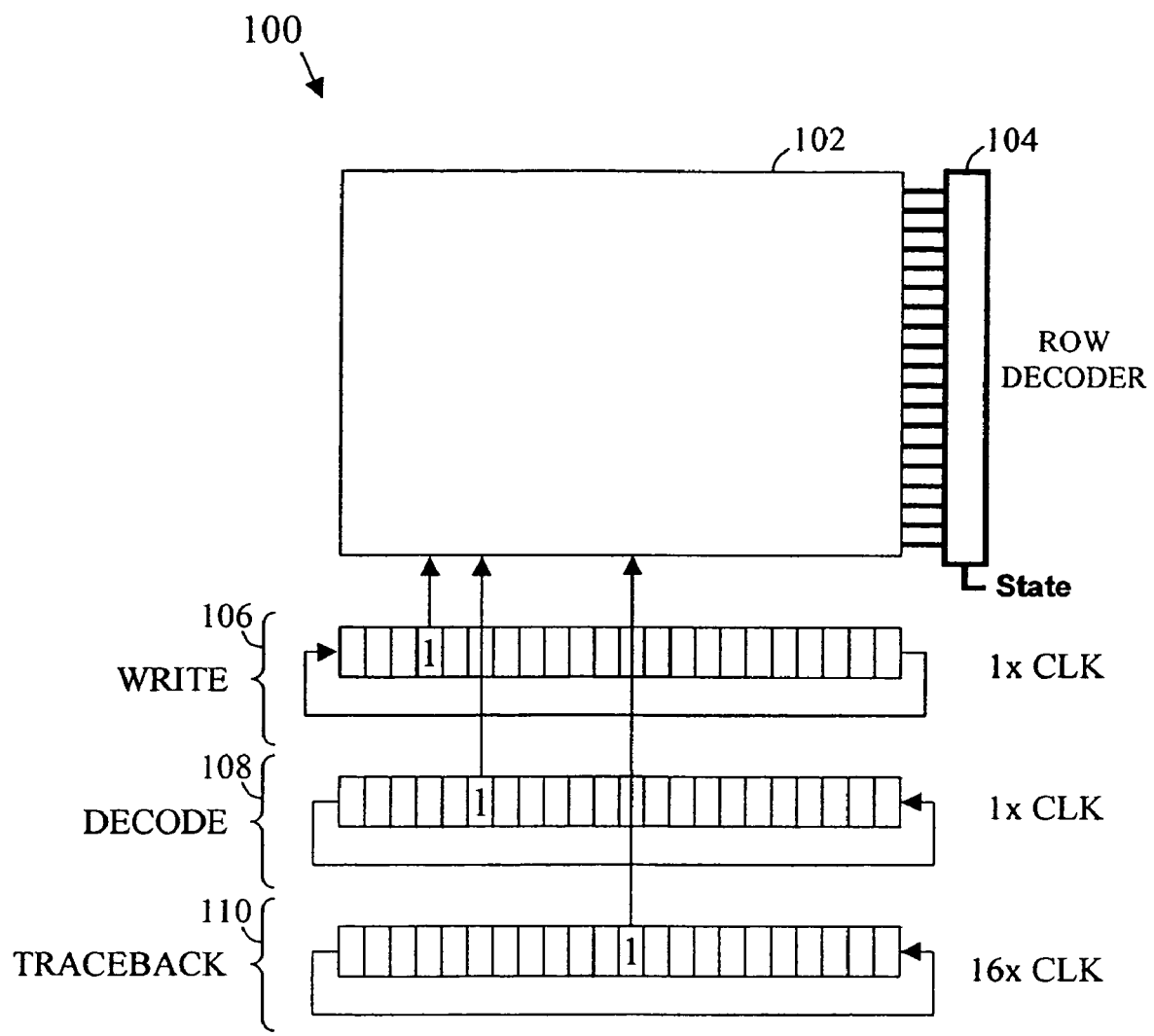
FIG. 5 is a block diagram illustrating an example traceback memory in accordance with an embodiment of the present invention.

FIG. 5 is a block diagram illustrating an example traceback memory 100 in accordance with an embodiment of the present invention. As shown in FIG. 5, the traceback memory 100 may include: a memory chip 102, a row decoder 104, a write shift register ring 106, a decode shift register ring 108, and a traceback shift register ring 110. The memory chip 102 and the row decoder 104 may operate in a similar manner to the corresponding elements in FIG. 2, as described previously. The shift register rings 106, 108, 110 may operate by each shifting a logic one value (or some other value) sequentially through the associated rings to act as column enable signals for the memory chip 102. The write shift register ring 106 is for use during write operations to store survivor transition information to the memory chip 102. The decode shift register ring 108 and the traceback shift register ring 110 are used during decode operations and traceback operations, respectively. As shown, the shift direction of the write shift register ring 106 is opposite to that of the decode shift register ring 108 and the traceback shift register ring 110. In addition, the traceback shift register ring 110 operates at a higher clock speed than the write shift register ring 106 and the decode shift register ring 108 in the illustrated embodiment (although other embodiments exist where this is not the case). The frequency of the traceback and the write/decode clocks will typically depend on how many ACS blocks are used in the corresponding ACS unit. In other words, it depends on how many bits are being written into the traceback in one cycle. This will depend on the particular implementation. The traceback clock will typically be equal to or some integral multiple of the write/decode clocks.

Figure 6:
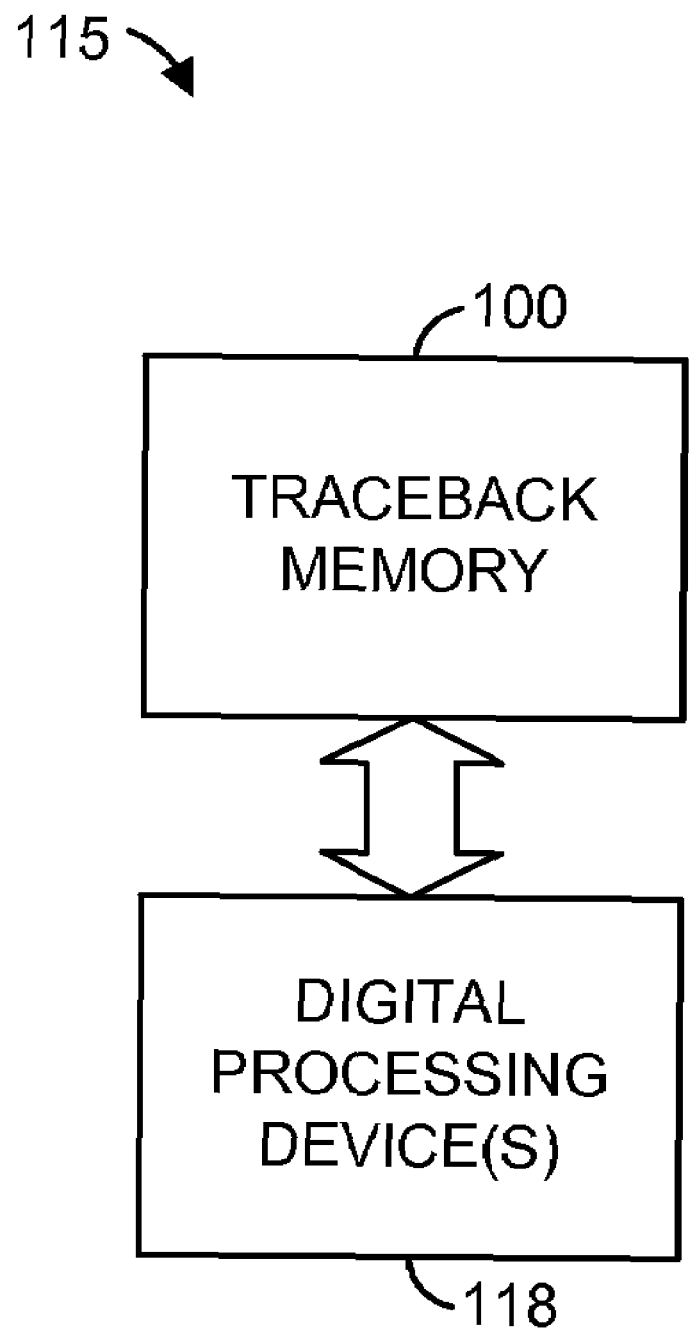
FIG. 6 is a block diagram illustrating an example Viterbi decoder 115 in accordance with an embodiment of the invention.

FIG. 6 is a block diagram illustrating an example Viterbi decoder 115 in accordance with an embodiment of the invention. The Viterbi decoder 115 includes a traceback memory, such as the traceback memory 100 of FIG. 5, coupled to one or more digital processing devices 118 to perform Viterbi decoding for a corresponding system. The digital processing device(s) 118 may include, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others, including combinations of the above. The digital processing device(s) 118 may control, for example, the writing of survivor transition information to the traceback memory 100, the performance of traceback operations using data stored within the traceback memory 100, the performance of decode operations using data stored within the traceback memory 100, and/or other functions.

In at least one embodiment of the present invention, distributed logic circuitry is used to control the location of the logic one bits within the write shift register ring 106, the decode shift register ring 108, and the traceback shift register ring 110. A traceback operation may be considered completed when the traceback pointer (i.e., the logic one within the traceback shift register ring 110 of FIG. 5) meets the current write pointer (i.e., the logic one within the write shift register ring 106 of FIG. 5). When this occurs, a new traceback operation may be initiated on an opposite side of the write pointer. The distributed control circuitry may be configured to, among others things, perform this task.

Figure 7:
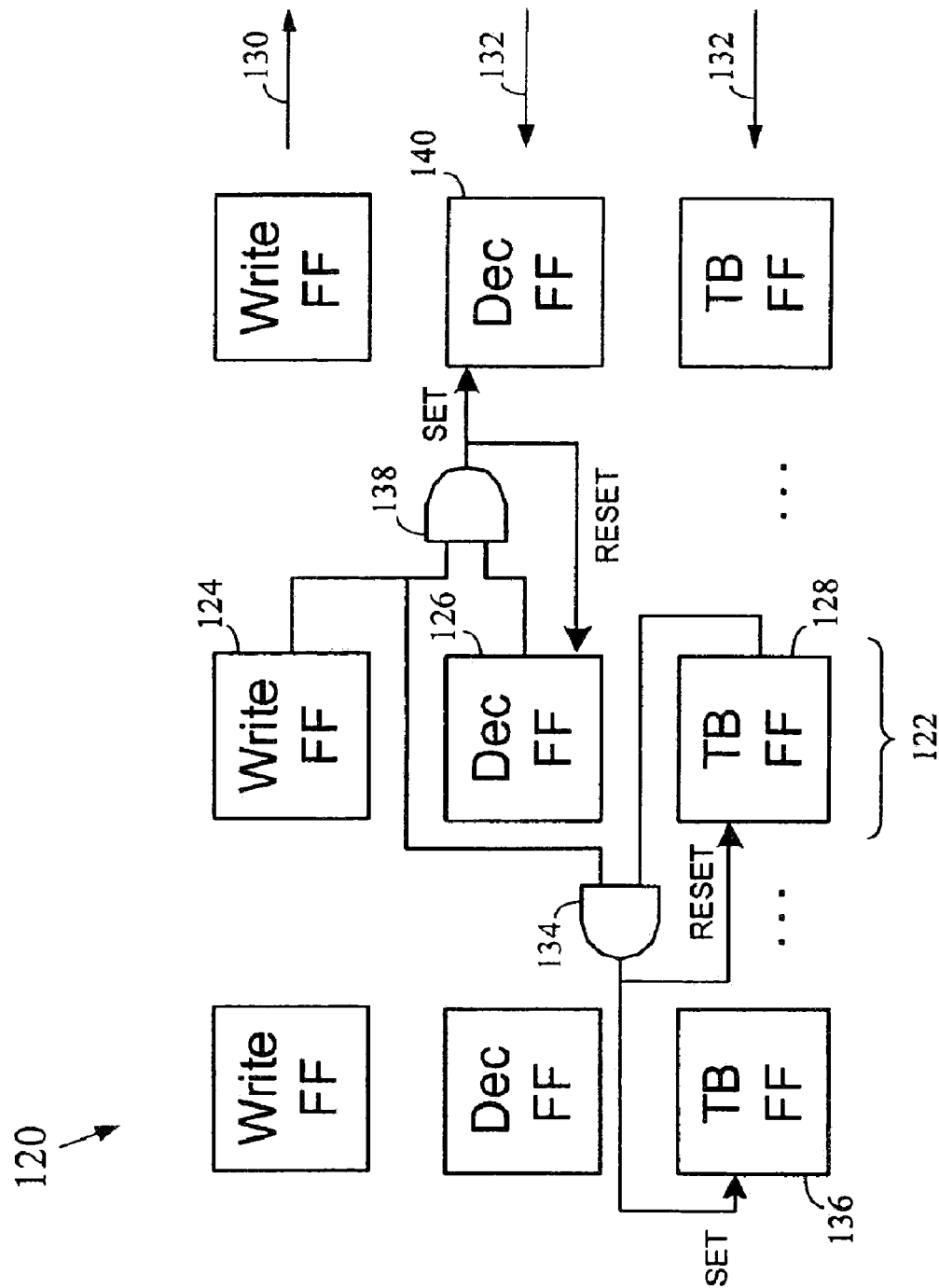
FIG. 7 is a schematic diagram illustrating example logic circuitry that may be used in a traceback memory in accordance with an embodiment of the present invention.

FIG. 7 is a schematic diagram illustrating an example circuit arrangement 120 that includes logic circuitry for use within a traceback memory in accordance with an embodiment of the present invention. The logic circuitry of FIG. 7 is shown for only one ring position. It should be appreciated, however, that the same or similar circuitry may be repeated for each ring position in a traceback memory. As shown in FIG. 7, for a particular column 122 of a traceback memory, there is one write flip flop (or data latch) 124, one decode flip flop (or data latch) 126, and one traceback flip flop (or data latch) 128. A logic one (or other data value) will propagate through the write flip flops in a first direction 130 and logic ones will propagate through the decode flip flops and the traceback flip flops in an opposite direction 132 (although at different speeds). A first AND gate 134 is provided that has one input connected to the data output of the write flip flop 124 and one input connected to the data output of the traceback flip flop 128. The output of the AND gate 134 is coupled to a SET input of a traceback flip flop 136 to the left of the traceback flip flop 128. The traceback flip flop 136 is not necessarily adjacent to the traceback flip flop 128. That is, there may be one or more flip flops between the two. The separation will typically be implementation specific. When the flip flops 124, 128 have different stored values or both have stored logic zeros, the value stored in flip flop 136 does not change. When the flip flops 124, 128 both have logic ones stored therein, on the other hand, flip flop 136 is set to a logic one, thus initiating a new traceback operation on the opposite side of the write pointer. Flip flop 128 will also be reset at this time (to a logic zero) so that there is only one logic one in the traceback shift register ring.

The circuit arrangement 120 may also include a second AND gate 138. The second AND gate 138 may have one input connected to the data output of the write flip flop 124 and one input connected to the data output of the decode flip flop 126. The output of the second AND gate 138 may be connected to a SET input of a decode flip flop 140 to the right of decode flip flop 126. Thus, when a logic one is stored within both decode flip flop 126 and write flip flop 124, the decode flip flop 140 is set to a logic one. At about the same time, the decode flip flop 126 may be reset to a logic zero. The decode flip flop 140 will typically be a number of flip flops away from flip flop 126 (e.g., 16 flip flops in one embodiment). In this manner, the decode pointer will continually move toward the write pointer and then be sent back again during decoder processing. It should be appreciated that the specific distributed control circuitry illustrated in FIG. 7 is only one way to implement distributed control circuitry within a traceback memory that uses shift register rings. Other control circuitry arrangements may alternatively be used.

In one aspect of the present invention, the use of shift register rings permits a level of reconfigurability to be achieved in a traceback memory to operate with, for example, different encoding standards. Reconfigurability may require, for example, that a traceback memory support different numbers of states, different numbers of transitions, and/or different traceback lengths. By including enough memory for the maximum possible application, different standards may be handled by changing, for example, the clock frequencies and the clock ratios between the various rings. The traceback length may be changed without changing functionality. Because increasing the traceback length is a diminishing improvement in terms of signal-to-noise ratio, but presents only a minimal increase in energy and latency, only several different ring sizes are typically needed to implement an energy efficient reconfigurable traceback memory.

Figure 8:
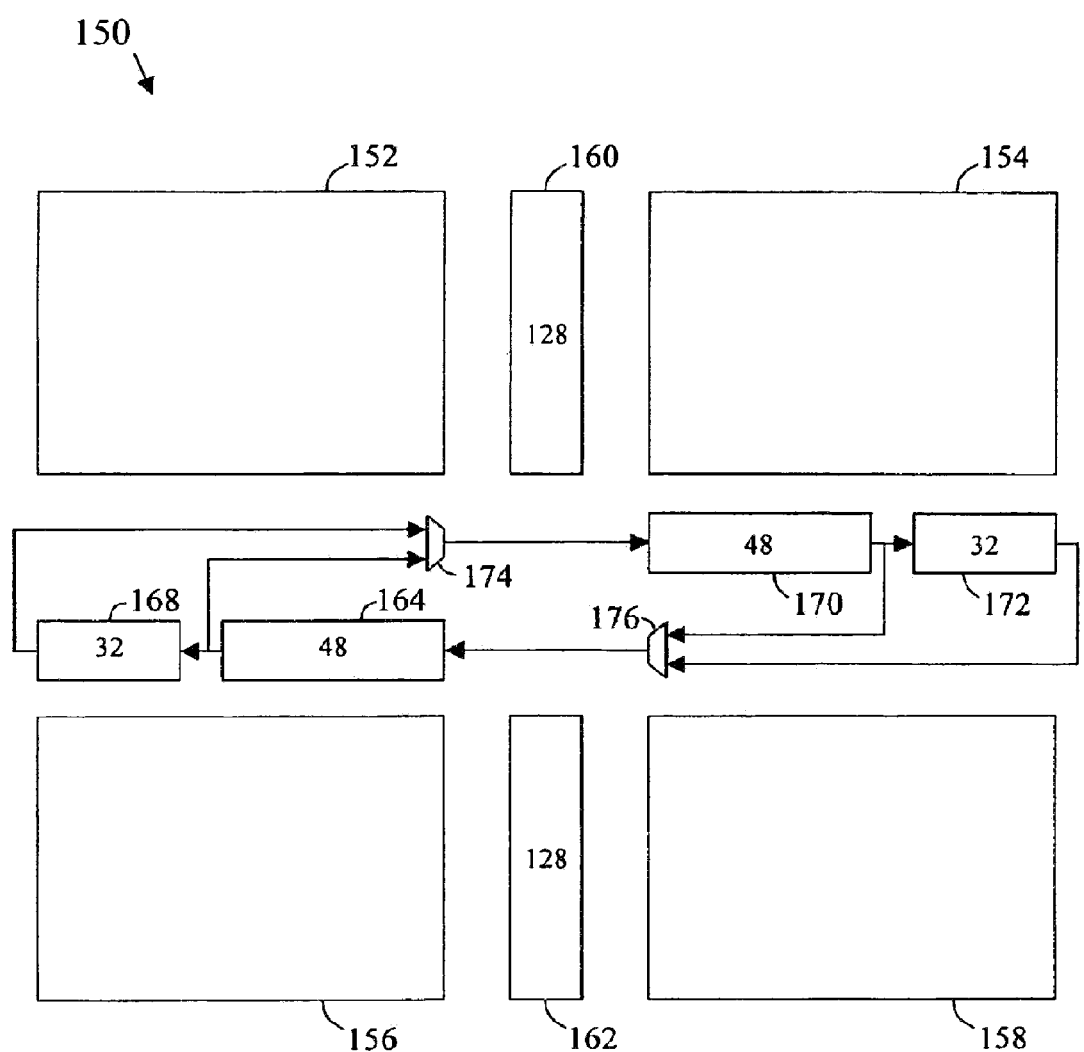
FIG. 8 is a block diagram illustrating an example reconfigurable traceback memory in accordance with an embodiment of the present invention.

FIG. 8 is a block diagram illustrating an example reconfigurable traceback memory 150 in accordance with an embodiment of the present invention. As illustrated, the reconfigurable traceback memory 150 may include: first, second, third, and fourth memory chips 152, 154, 156, 158; first and second row decoders 160, 162; a first 48 column shift register portion 164, a first 32 column shift register portion 168, a second 48 column shift register portion 170, a second 32 column shift register portion 172, and first and second multiplexers (MUXs) 174, 176. The first row decoder 160 is operative for enabling a selected row within memory chips 152 and 154. Likewise, the second row decoder 162 is operative for enabling a selected row within memory chips 156 and 158. The first and second MUXs 174, 176 allow a variable size shift register ring to be achieved for the traceback memory 150 to support different standards. For example, in one implantation, the MUXs 174, 176 may be controlled to form a ring from just the two 48 position shift register portions 164, 170 to form a 96 position ring. In another implementation, all of the shift register portions 164, 168, 170, 172 may be combined to form a 160 position ring. Other combinations may alternatively be made. Any number of shift register portions and MUXs may be used within a reconfigurable traceback memory. Similarly, any size of shift register portions may be used. Although illustrated with only one, there will typically be three reconfigurable shift register arrangements within a traceback memory. Any number of memory chips may also be used within a reconfigurable traceback memory. Other reconfigurable traceback memory architectures may alternatively be used.

The techniques and structures of the present invention may be implemented in any of a variety of different forms. For example, features of the invention may be embodied within cellular telephones and other handheld wireless communicators; personal digital assistants having wireless capability; laptop, palmtop, desktop, and tablet computers having wireless capability; pagers; satellite communicators; network interface cards (NICs) and other network interface structures; integrated circuits; wired communication systems and devices; digital data storage devices including, for example, hard disk drives; as instructions and/or data structures stored on machine readable media; and/or in other formats.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A traceback memory, comprising:
a memory chip having rows and columns to store survivor transition information; and
a write shift register ring to enable columns of said memory chip during write operations by shifting a predetermined data value through said write shift register ring in a sequential manner;
a traceback shift register ring to enable columns of said memory chip during traceback read operations by shifting a predetermined data value through said traceback shift register ring in a sequential manner, wherein said predetermined data value is shifted through said traceback shift register ring in an opposite direction than said predetermined data value in said write shift register ring; and
a decode shift register ring to enable columns of said memory chip during decode operations by shifting a predetermined data value through said decode shift register ring in a sequential manner, wherein said predetermined data value is shifted through said decode shift register ring in an opposite direction than said predetermined data value in said write shift register ring.

2. The traceback memory of claim 1, wherein:
said write shift register ring and said decode shift register ring operate at the same clock speed and said traceback shift register ring operates at a different, higher clock speed.

3. The traceback memory of claim 1, wherein:
said predetermined data value is a logic one.

4. The traceback memory of claim 1, wherein:
said write shift register ring includes a plurality of flip flops connected in a ring configuration.

5. The traceback memory of claim 1, wherein:
said write shift register ring includes a plurality of data latches connected in a ring configuration.

6. The traceback memory of claim 1, further comprising:
a row decoder to enable a selected row of said memory chip in response to a state address.

7. The traceback memory of claim 1, further comprising:
first logic circuitry connected to said write shift register ring and said traceback shift register ring to initiate a new traceback operation based on the proximity of a traceback pointer to a write pointer.

8. The traceback memory of claim 7, wherein:
said first logic circuitry includes an AND gate for each position in said write shift register ring.

9. The traceback memory of claim 7, further comprising:
second logic circuitry connected to said write shift register ring and said decode shift register ring to reposition a decode pointer based on the proximity of a decode pointer to said write pointer.

10. The traceback memory of claim 9, wherein:
said second logic circuitry includes an AND gate for each position in said write shift register ring.

11. A method comprising:
shifting a predetermined data value through a first shift register ring in a Viterbi decoder to sequentially enable columns in a traceback memory to write trellis survivor transition data to storage locations in said columns;
shifting a predetermined data value through a second shift register ring in said Viterbi decoder to sequentially enable columns in said traceback memory to perform traceback read functions for said Viterbi decoder, wherein said predetermined value is shifted through said second shift register ring in an opposite direction from said predetermined value in said first shift register ring; and
shifting a predetermined data value through a third shift register ring in said Viterbi decoder to sequentially enable columns in said traceback memory to perform decode read functions for said Viterbi decoder, wherein said predetermined value is shifted through said third shift register ring in an opposite direction from said predetermined value in said first shift register ring.

12. The method of claim 11, wherein:
shifting a predetermined data value through said first shift register ring and shifting a predetermined data value through said third shift register ring are performed at the same clock speed and shifting a predetermined data value through said second shift register ring is performed at a different, faster clock speed.

13. The method of claim 11, further comprising:
repositioning a decode pointer within said third shift register ring when said decode pointer is proximate to a write pointer within said first shift register ring.

14. The method of claim 11, wherein:
said predetermined data value is a logic one.

15. The method of claim 11, further comprising:
initiating a new traceback operation when a traceback pointer within said second shift register ring is proximate to a write pointer within said first shift register ring.

16. The method of claim 15, wherein:
initiating a new traceback operation includes initiating said new traceback operation when said traceback pointer within said second shift register ring is at the same position as said write pointer within said first shift register ring.

17. A Viterbi decoder comprising:
a traceback memory having:
  a memory chip having rows and columns to store survivor transition information;
  a write shift register ring to enable columns of said memory chip during write operations by shifting a predetermined data value through said write shift register ring in a sequential manner;
  a traceback shift register ring to enable columns of said memory chip during traceback read operations by shifting a predetermined data value through said traceback shift register ring in a sequential manner, wherein said predetermined data value is shifted through said traceback shift register ring in an opposite direction than said predetermined data value in said write shift register ring;
  a decode shift register ring to enable columns of said memory chip during decode operations by shifting a predetermined data value through said decode shift register ring in a sequential manner, wherein said predetermined data value is shifted through said decode shift register ring in an opposite direction than said predetermined data value in said write shift register ring; and
wherein said Viterbi decoder further comprises at least one digital processing device to control the writing of survivor transition information to said traceback memory.

18. The Viterbi decoder of claim 17, wherein:
said at least one digital processing device is configured to control the performance of traceback operations in said Viterbi decoder using information stored in said traceback memory.

19. The Viterbi decoder of claim 17, wherein:
said at least one digital processing device is configured to control the performance of decode operations in said Viterbi decoder using information stored in said traceback memory.

20. The Viterbi decoder of claim 17, wherein:
said at least one digital processing device comprises a digital signal processor.

* * * * *